United States Patent [19]

Best et al.

[11] 4,390,988
[45] Jun. 28, 1983

[54] EFFICIENT MEANS FOR IMPLEMENTING MANY-TO-ONE MULTIPLEXING LOGIC IN CMOS/SOS

[75] Inventors: David W. Best, Marion; Jeffrey D. Russell, Cedar Rapids, both of Iowa

[73] Assignee: Rockwell International Corporation, El Segundo, Calif.

[21] Appl. No.: 283,264

[22] Filed: Jul. 14, 1981

[51] Int. Cl.³ .................... H04J 3/02; H03K 17/00
[52] U.S. Cl. ........................... 370/113; 370/112; 307/243; 328/104
[58] Field of Search ............. 370/112, 113, 114, 44, 370/8; 307/496, 573-576, 241, 243; 328/104, 154

[56] References Cited

U.S. PATENT DOCUMENTS

| | | | |
|---|---|---|---|
| 3,654,394 | 4/1972 | Gordon | 307/573 |
| 3,702,943 | 11/1972 | Heuner et al. | 307/576 |
| 3,902,078 | 8/1975 | Peterson | 307/573 |

Primary Examiner—Douglas W. Olms
Attorney, Agent, or Firm—Bruce C. Lutz; Howard R. Greenberg; H. Fredrick Hamann

[57] ABSTRACT

A circuit for multiplexing a plurality of input signals to a single output signal through the use of N and P channel FETs whereby complementary switching circuitry results in a minimization of power usage in either the active or static circuit conditions. This is accomplished by using a feedback technique and area sizing of the FETs to obtain optimum operational results in addition to the minimal power requirements.

7 Claims, 3 Drawing Figures

EFFICIENT MEANS FOR IMPLEMENTING MANY-TO-ONE MULTIPLEXING LOGIC IN CMOS/SOS

INVENTION

The present invention is generally related to electronics and more specifically related to signal multiplexing. Even more specifically, the circuit is related to CMOS technology which minimizes the number of circuit components and circuit power requirements.

While it is recognized that there are many types of multiplexers, the present inventive concept uses a minimum number of components to produce a signal multiplexing action. In the present invention, signals are input to the drain of a plurality of N channel FETs (field effect transistors), each of which are commonly connected at the source. Signals appearing at the source are inverted before being output. A P channel FET is used as a variable impedance between a power supply and the input of the inverter and is controlled by the logic level at the output of the inverter. When a given signal being multiplexed is at a logic one level, there is no current flow from the power supply since the power supply voltage is also at an essentially logic one level. When the signal being multiplexed is a logic zero, the P channel transistor is turned to an OFF condition to help reinforce the logic zero level input to the inverter thereby preventing current flow from the power supply. Additionally, with no signals input, the input to the inverter is a logic zero and the P channel transistor remains in an OFF condition to prevent wasteful current draw or static current flow when the circuit is not being utilized.

It is therefore an object of the present invention, to minimize circuit component numbers and power consumption in a signal multiplexer.

Other objects and advantages of the present invention may be ascertained from a reading of the specification and appended claims in conjunction with the drawings wherein:

DETAILED DESCRIPTION

Figure 1:
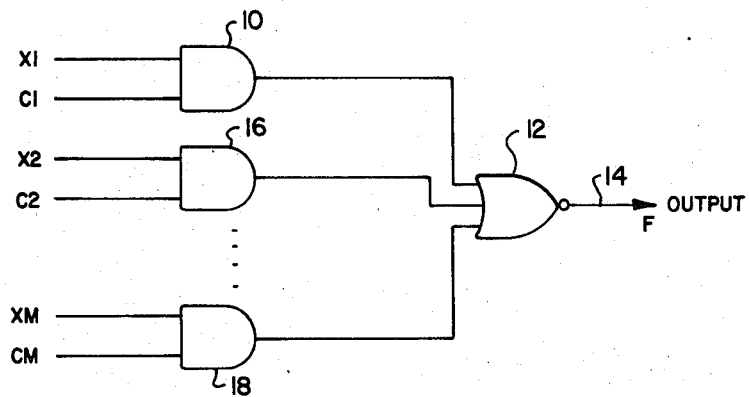
FIG. 1 is a schematic diagram of a prior art embodiment of a multiplexer.

In FIG. 1 an AND gate 10 receives inputs X1 and C1 and provides an output to a first input of an OR gate 12 having an output 14. A second AND gate 16 has inputs X2 and C2 and supplies a second input to OR gate 12. A third AND gate 18 has inputs XM and CM and provides a final input to OR gate 12. Between AND gates 16 and 18 are four dots indicating that there may be any number of additional AND gates.

Figure 2:
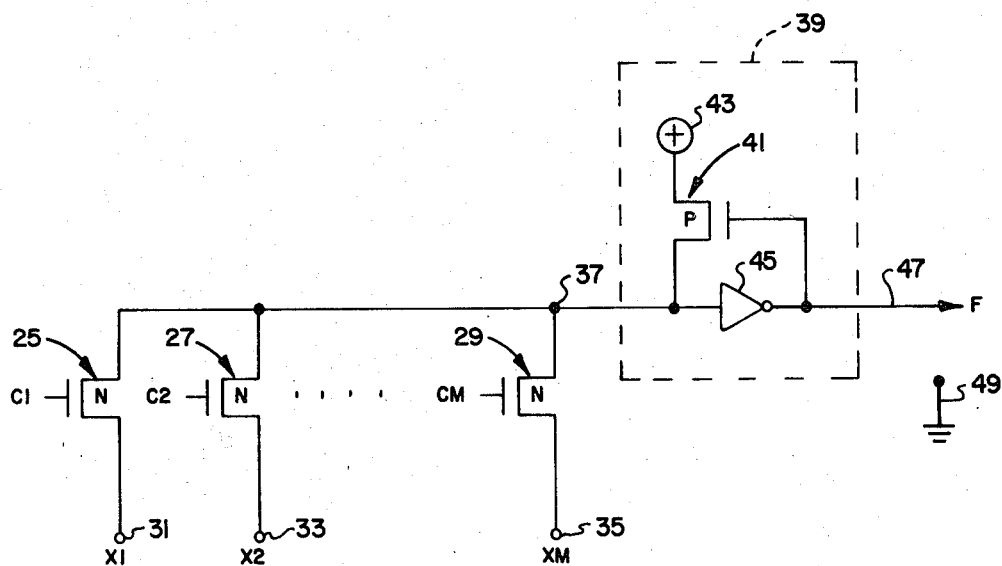
FIG. 2 is a detailed schematic diagram of one embodiment of the inventive concept.

In FIG. 2 three N channel FET CMOS transistors, transfer gates, or gating means generally designated as 25, 27, and 29 are illustrated each having a drain terminal connected to terminals which are marked respectively as 31, 33 and 35. The source terminal of each of these N channel transistors 25-29 are connected to a common port, input node, first terminal or junction point 37. A gate or control means of transistor 25 is connected to a signal source labeled C1 while a signal source C2 is connected to the gate of transistor 27 and source CM is connected to control FET 29. A dash line box 39 contains a P channel FET transistor, feedback means, gating means, or signal reinforcing means 41 having its source connected to a positive power supply potential 43 and its drain connected to junction 37. An inverter 45 is connected between junction point 37 and an apparatus output 47. Output 47 is connected to the gate of FET 41. Signals are output between terminal 47 and ground 49.

Figure 3:
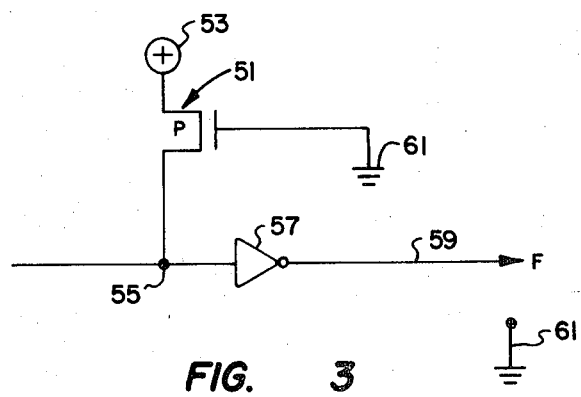
FIG. 3 illustrates a modification of FIG. 2 which may be utilized for some applications.

In FIG. 3 a P channel transistor 51 is shown connected between a power supply lead 53 and a junction point 55 which acts as an input to an inverter 57 connected to an output 59. Signals are provided between output 59 and a ground 61. Ground 61 is also connected to the gate of P channel transistor 51.

OPERATION

As is well known to those skilled in the art, a multiplexer is a multiple input, single output logic element, whose output assumes the state of one selected input. This output may or may not be inverted as compared to the selected input.

Referring to FIG. 1 the signal inputs are designated as X with a subscript from 1 through M and the output is designated as F. These inputs are selected by a control signal designated as C. These control signals are supplied to the AND gates 10 through 18 as inputs C1 through CM. Thus, the control inputs are employed to select which one of the signal inputs will be directed to the output. The control inputs are derived by some such means (such as a decoder) in a way that only one is active. With this restriction in force, then $F = \overline{X}i$ if Ci is active.

In FIG. 2 a plurality of N channel FET CMOS transfer gates 25 through 29 are employed for input gating. If a control input such as C2 is a logic one or active high, the signal X2 is applied to junction point 37 of inverter 45. Thus, the logic value appearing at X2 also appears at junction point 37 and all the remaining FETs are in an OFF state. Thus, the inverter input is X2 and the output on lead 47 due to the inversion is $\overline{X2}$.

If the signal X2 is a logic zero (nearly zero volts) and FET 27 is fully ON the inverter input follows to a logic zero. The output of the inverter is a logic one thereby maintaining FET 41 in an OFF condition. If the signal X2 is a logic one (nearly the same potential as power supply terminal 43) the inverter input rises to some value less than logic one due to the voltage drop in the N channel transistor 27. This voltage level is sufficient to begin turning ON the inverter 45 but insufficient to fully do so. The commencing change in potential at output 47, however, activates P channel transistor 41 toward an On condition to continue pulling up the potential at lead 37 so as to turn inverter 45 to a fully ON condition. Thus, the transistor 41 acts to reinforce the logic levels being supplied through the multiplexing network to the input of inverter 45. This reinforcing or feedback action results in a fully recovered high voltage level on the input node 37 of inverter 45 when any of the supplied or passed inputs such as X2 is high. In other words, the threshold drop normally found through the N channel transistor is recovered.

If the logic level of the signal X2 is now returned to logic zero, the N FET 27 conducts in an attempt to pull the input node 37 low. It is now "fighting" against the P channel FET 41 which is pulling the input node high. Thus, it is an important part of the teaching of this application that the N and P channel FETs must be properly sized so that the N FET transistors such as 27 have a lower ON resistance than the P FET transistors. It should be noted that for the same land area size on the CMOS chip, an N FET has typically half the ON resistance of a P FET transistor. In designing the present circuit, it was determined that it was desirable to have the N FET land area approximately twice the size of the P FET transistor 41 and thus the ON resistance of the N channel FET transistors are approximately ¼ the ON resistance of the P channel FET transistor 41. With this type of sizing for resistance value, the input node 37 will begin to drop to less than half the supply voltage supplied by 43 which in turn begins to switch the inverter output towards this higher potential. This removes voltage from the gate of the P FET transistor 41 thereby lowering its conductivity. This reinforcing or feedback action continues the voltage drop at junction point 37 thereby resulting in the input node being allowed to go fully to logic zero level and the P FET 41 to be completely turned OFF as a result of the feedback action.

It should be noted that if one of the gating transistors such as 27 is turned to an ON condition and the signal input such as X2 is a logic zero, the P FET 41 is turned OFF thereby preventing current flow from supply 43 through the inverter 45 or transistor 27 to minimize current flow. On the other hand, if transistor 27 is ON and the input signal X2 applied at 33 is a logic one, the potential is very nearly that of the potential of 43 and therefore again there is no current flow to the signal source for X2. Finally, if none of the control transistors of the N channel type are in a controlled ON condition, the junction point 37 is of such a value that the P channel transistor 41 is in an OFF condition and there is no static current flow. Thus, a major feature of the present inventive concept is the minimal current flow whether the circuit is operating or not.

Another advantage of the present invention, is the small number of transistors required. For an N input multiplexer designed on the basis illustrated in the prior art FIG. 1, there are typically required approximately 4N transistors where N is the number of gates utilized in the multiplexer. The present invention, on the other hand, for an N input multiplexer, requires N+3 transistors wherein two of these transistors are in the inverter.

The modification to FIG. 2 as illustrated in FIG. 3 shows the gate of transistor 51 connected to ground 61 rather than being connected to the output of inverter 57. This is the only difference between FIG. 2 and FIG. 3. Such an arrangement allows the circuit to function properly, still minimizes the number of transistors but does waste power in the static mode. However, there may be some situations where it is desirable to have the gate of transistor 51 isolated from the output of the multiplexing circuit.

As will be apparent to those skilled in the art, the polarity of the gating and reinforcing transistors may be inverted along with the logic levels of the input and control signals if so desired and still fall within the scope of the inventive concept.

In summary, it is to be realized that the inventive concept utilizes a plurality of switching gates to pass one of a plurality of input logic level signals to a common port which common port is connected to a given logic level through further gating means. The further gating means reinforces the logic levels appearing at the common port to keep these logic levels within specific parameters.

It is to be realized that other modifications to the circuit illustrated may be made and still fall within the inventive concept. Therefore, we wish to be limited not by the specific circuitry illustrated but only by the scope of the appended claims, wherein we claim:

We claim:

1. Multiplexing circuitry comprising, in combination:
   a plurality M of signal supply input means;
   a plurality M of N channel FETs each including control means, source means and drain means wherein the drain thereof is connected to a corresponding one of said plurality of signal input means;
   a plurality M of control signal supply means connected to corresponding control means of said N channel FETs;
   apparatus output means;
   signal isolation means connected between said source means of each of said N channel FETs and said apparatus output means;
   power supply means including positive terminal means; and
   P channel FET means including drain, source and gate means, wherein said gate means is connected to said apparatus output means and said P channel FET operates to connect the input of said signal isolation means to said power supply means when a signal representing a logic zero appears at said apparatus output means.

2. Apparatus for multiplexing signals while reducing current consumption comprising, in combination:
   a first plurality of FET gating means of a first polarity, each of said gating means including control means and signal passage means;
   power supply means;
   means for supplying signals to be multiplexed having first and second logic values to said gating means;
   apparatus output means;
   inverter means, including input means and an output, connected to said gating means and said apparatus output means, for outputting inverted signals as passed by said gating means to said apparatus output means;
   second gating means, including control input means of a second polarity type connected between said input means of said inverter means and said power supply means for electrically connecting said input means of said inverter means to said power supply in response to control signals received by said second gating means; and
   means connecting said apparatus output means to said control means of said second gating means for reinforcing signals input to said inverter means whereby said second gating means is switched to an ON condition for a first logic value input signal being multiplexed and is switched OFF for a second logic level of signal being multiplexed whereby there is minimal static current flow.

3. Apparatus of the class described comprising, in combination:
   a plurality, of gating means of a first polarity, each of said gating means including control means and signal input means and signal output means;
   further gating means of a polarity opposite said first polarity connected between a power source and said output means of said first plurality of gating means for reinforcing signals passed by said first plurality of gating means, said further gating means including control means; and inverter means connected between said output means of said first plurality of gating means and said control input of said further gating means.

4. Apparatus for reducing current consumption in a gate type multiplexing circuit comprising, in combination:

signal input means for receiving one of multiple logic level signals from a selection circuit;

apparatus output means;

inverter means connected between said signal input means and said apparatus output means; and reinforcing gating means connected across said inverter means for reinforcing the logic levels of signals input to said apparatus.

5. Apparatus for reducing current consumption in a multiplexing circuit comprising, in combination:

power supply means;

signal input means for supplying signals of first and second logic values from a signal selection circuit; and gating means connected between said power supply means and said signal input means for connecting said signal input means to said power supply means when signals are received of a first logic value approaching the voltage level of the power supply means thereby minimizing active current flow and for disconnecting said signal input means from effective electrical connection with said power supply means when the signals received are of a second logic value thereby minimizing static current flow.

6. Apparatus for multiplexing a plurality of input signals to a single output signal comprising, in combination:

means for selectively supplying one of a plurality of first signals through a plurality of FET gates to a first terminal means;

means for inverting the signal supplied to said first terminal to generate an output second signal; and means for reinforcing the logic level of the signal at said first terminal, comprising an opposite polarity gating means controlled in accordance with the logic level of said second signal.

7. The method of multiplexing a plurality of input signals to a single output signal comprising the steps of:

inputting first signals to be multiplexed through a plurality of first polarity FET gates in response to control signals supplied to said first polarity FET gates, inverting said first signals as passed by said first polarity FET gates to provide multiplexed output signals;

reinforcing the logic level of said first signals and minimizing current draw with a second polarity FET gate by connecting an input of the means for inverting to a power supply terminal means when the logic level of the signal input is similar to the voltage level of the power supply terminal means and effectively disconnecting the input of the means for inverting from the power supply terminal means when the logic level of the signal input changes whereby there is minimal static current flow.

* * * * *